(12) United States Patent
Buet et al.

(10) Patent No.: US 10,597,782 B2
(45) Date of Patent: Mar. 24, 2020

(54) DEVICE FOR COATING ONE OR MORE YARNS BY A VAPOR DEPOSITION METHOD

(71) Applicant: SAFRAN CERAMICS, Le Haillan (FR)

(72) Inventors: Emilien Buet, Saint Medard en Jalles (FR); Simon Thibaud, Pessac (FR); Adrien Delcamp, Merignac (FR); Cédric Descamps, Eysines (FR)

(73) Assignee: SAFRAN CERAMICS, Velizy-Villacoublay (FR)

( * ) Notice: Subject to any disclaimer, the term of this patent is extended or adjusted under 35 U.S.C. 154(b) by 0 days.

(21) Appl. No.: 15/777,492

(22) PCT Filed: Nov. 17, 2016

(86) PCT No.: PCT/FR2016/052990
§ 371 (c)(1),
(2) Date: May 18, 2018

(87) PCT Pub. No.: WO2017/085412
PCT Pub. Date: May 26, 2017

(65) Prior Publication Data
US 2018/0347048 A1     Dec. 6, 2018

(30) Foreign Application Priority Data

Nov. 19, 2015 (FR) ...................... 15 61149

(51) Int. Cl.
*C23C 16/44* (2006.01)
*C23C 16/455* (2006.01)
(Continued)

(52) U.S. Cl.
CPC .......... *C23C 16/545* (2013.01); *C23C 14/562* (2013.01); *C23C 16/26* (2013.01);
(Continued)

(58) Field of Classification Search
CPC ....... C23C 14/562; C23C 16/545; D06B 1/14; D06B 3/045; D06M 11/73
See application file for complete search history.

(56) References Cited

U.S. PATENT DOCUMENTS 3,367,304 A    2/1968  Robbins
3,908,585 A *  9/1975  Griffin .................... B05B 13/00
                                                    118/718
(Continued)

FOREIGN PATENT DOCUMENTS

CN    103722785 A    4/2014
CN    104046943 A    9/2014
(Continued)

OTHER PUBLICATIONS

International Search Report as issued in International Patent Application No. PCT/FR2016/052990, dated Feb. 2, 2017.
(Continued)

*Primary Examiner* — Parviz Hassanzadeh
*Assistant Examiner* — Nathan K Ford
(74) *Attorney, Agent, or Firm* — Pillsbury Winthrop Shaw Pittman LLP

(57) ABSTRACT

A device for coating one or more yarns by a vapor deposition method, the device including a treatment chamber defining a first and a second treatment zone in which at least one yarn is to be coated by performing a vapor deposition method, the first and second zones being separated by a wall and the first zone surrounding the second zone, or being superposed on the second zone; a conveyor system to transport the at least one yarn through the first and second zones; a first injector device to inject a first treatment gas phase into the first zone and a first removal device configured to remove the residual first gas phase from the first zone; and a second injector device configured to inject a second treatment gas phase into
(Continued)

the second zone, and a second removal device configured to remove the residual second gas phase from the second zone.

19 Claims, 3 Drawing Sheets

(51) Int. Cl.
| | |
|---|---|
| *C23C 16/54* | (2006.01) |
| *C23C 16/26* | (2006.01) |
| *C23C 16/32* | (2006.01) |
| *D06B 3/04* | (2006.01) |
| *D06M 11/73* | (2006.01) |
| *C23C 14/56* | (2006.01) |
| *D06M 101/40* | (2006.01) |
| *D06M 11/58* | (2006.01) |
| *D06M 11/74* | (2006.01) |

(52) U.S. Cl.
CPC ........ *C23C 16/325* (2013.01); *C23C 16/4412* (2013.01); *C23C 16/45563* (2013.01); *D06B 3/045* (2013.01); *D06M 11/73* (2013.01); *D06M 11/58* (2013.01); *D06M 11/74* (2013.01); *D06M 2101/40* (2013.01)

(56) References Cited

U.S. PATENT DOCUMENTS

| | | | |
|---|---|---|---|
| 6,067,931 A * | 5/2000 | Ghezzo | H01L 21/67115 118/724 |
| 10,056,237 B2 | 8/2018 | Gorokhovsky et al. | |
| 2007/0099527 A1 | 5/2007 | Brun et al. | |
| 2011/0214609 A1* | 9/2011 | Takahashi | C23C 16/448 118/718 |
| 2016/0068397 A1* | 3/2016 | Su | H01J 37/3277 427/577 |

FOREIGN PATENT DOCUMENTS

| | | |
|---|---|---|
| DE | 94 21 895 U1 | 3/1997 |
| FR | 91 083 E | 4/1968 |
| FR | 1 564 841 A | 4/1969 |
| GB | 2 421 960 A | 7/2006 |
| WO | WO 2005/028741 A1 | 3/2005 |
| WO | WO 2006/094285 A2 | 9/2006 |

OTHER PUBLICATIONS

International Preliminary Report on Patentability and the Written Opinion of the International Searching Authority as issued in International Patent Application No. PCT/FR2016/052990, dated May 22, 2018.

* cited by examiner

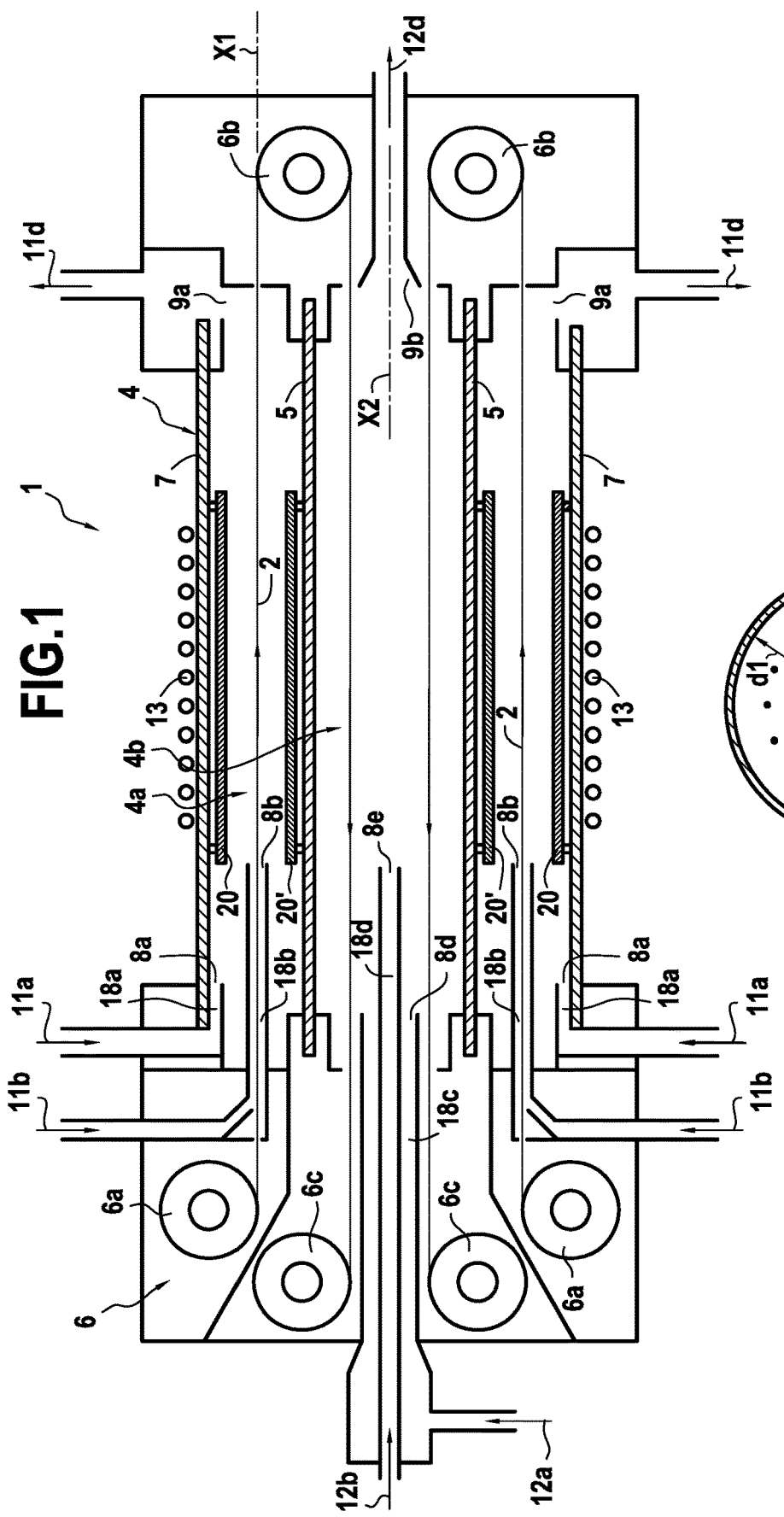

DEVICE FOR COATING ONE OR MORE YARNS BY A VAPOR DEPOSITION METHOD

CROSS REFERENCE TO RELATED APPLICATIONS

This application is the U.S. National Stage of PCT/FR2016/052990 filed Nov. 17, 2016, which in turn claims priority to French Application No. 1561149, filed Nov. 19, 2015. The contents of both applications are incorporated herein by reference in their entirety.

BACKGROUND OF THE INVENTION

The invention relates to devices and methods for coating one or more yarns by a vapor deposition method.

Ceramic matrix composite (CMC) materials are used at operating temperatures that are relatively high. Such materials comprise fiber reinforcement made up of yarns of ceramic or carbon materials present within a ceramic matrix.

While making parts out of CMC, a fiber texture that is to form the fiber reinforcement of the part may initially be obtained, e.g. by three-dimensional weaving. The fiber texture is then shaped in order to obtain a fiber preform having a shape that is close to the shape of the part that is to be fabricated. The preform is then densified in order to form the matrix and thus obtain the final part, with the matrix being made by way of example in full or in part by a chemical vapor infiltration (CVI) method or by a melt infiltration (MI) MI method, for example. Prior to the textile forming step (weaving, braiding, . . . ), the yarns may have been coated in an interphase coating serving to slow down rupture of the fibers of the yarns by cracks that start initially within the matrix. By way of example, the embrittlement-release interphase coating may be made of a material of lamellar structure that, on a crack reaching the interphase, is capable of dissipating the cracking energy by localized un-bonding at atomic scale so that the crack is deflected within the interphase. By way of example, materials constituting the embrittlement-release interphase may be pyrolytic carbon (PyC), and boron nitride (BN), which present a lamellar structure. By way of example, the interphase coating may be formed by chemical vapor deposition (CVD), by chemical vapor infiltration (CVI), or indeed by a liquid technique.

Devices suitable for continuously coating a plurality of yarns with an interphase by chemical vapor deposition are proposed in the literature. Such devices may include a treatment chamber through which a plurality of yarns for coating are transported by being driven by a pulley system. A reactive gas mixture is injected into the treatment chamber via an inlet orifice in order to form the interphase coating on the yarns by chemical vapor deposition. Any reactive gas mixture that has not reacted, together with by-products of the reaction are pumped out via an outlet orifice that is offset from the inlet orifice along the longitudinal axis of the treatment chamber. Multilayer interphase coatings can be made by placing a plurality of units of this type in series each including a device for injecting a gas phase and a device for removing the residual gas phase.

Nevertheless, it would be desirable to provide compact devices that enable multilayer coating to be made by chemical vapor deposition on one or more yarns. In addition, it may be desirable to provide devices that enable the number of yarns that can be treated per unit time to be increased.

Also known is Document FR 91 083, which describes a method of treating surfaces of textile materials, and Documents FR 1 564 841, US 2007/0099527, and DE 94 21 895, which describe methods of coating fibers.

There therefore exists a need to provide compact devices enabling a multilayer coating to be made by vapor deposition on one or more yarns.

There also exists a need to provide devices that enable the number of yarns that can be treated per unit time to be increased.

OBJECT AND SUMMARY OF THE INVENTION

To this end, in a first aspect, the invention provides a device for coating one or more yarns by a vapor deposition method, the device comprising at least:
  a treatment chamber defining at least a first treatment zone and a second treatment zone in which at least one yarn is to be coated by performing a vapor deposition method, the first and second zones being separated by a wall and the first zone surrounding the second zone, or being superposed on the second zone;
  a conveyor system configured to transport said at least one yarn through the first and second zones;
  a first injector device configured to inject a first treatment gas phase into the first zone and a first removal device configured to remove the residual first gas phase from the first zone; and
  a second injector device configured to inject a second treatment gas phase into the second zone, and a second removal device configured to remove the residual second gas phase from the second zone.

Advantageously, the invention provides compact devices enabling a multilayer coating to be made by vapor deposition on one or more yarns.

In an embodiment, the conveyor system may be configured to cause said at least one yarn to be transported continuously through the first and second zones. In other words, under such circumstances, the conveyor system is configured so that said at least one yarn does not stop as it travels through the first and second zones. Under such circumstances, said at least one yarn travels at a non-zero speed for the entire duration of its path through the first and second zones.

The device may also include a heater system configured to heat the first and second treatment zones.

In an embodiment, the first zone may extend along a first longitudinal axis, and at least one first injection channel may open out into the first zone, said first injection channel possibly being configured to inject at least a portion of the first gas phase into the first zone along a first injection direction that is not parallel to the first longitudinal axis.

Such a characteristic serves to improve the filling of the section of the first zone with the first gas phase, and thus serves to further improve the quality of the deposit formed on the yarn(s).

In an embodiment, the first injection direction forms an angle lying in the range 30° to 60° with the first longitudinal axis.

Such a characteristic serves to further improve the quality of the deposit formed on the yarn(s).

In a variant, the first injection direction may be substantially parallel to the first longitudinal axis.

In an embodiment, the second zone may extend along a second longitudinal axis, and at least one second injection channel may open out into the second zone, said second injection channel possibly being configured to inject at least a portion of the second gas phase into the second zone along an injection direction that is not parallel to the second longitudinal axis.

Such a characteristic serves to improve the filling of the section of the second zone with the second gas phase, and thus serves to further improve the quality of the deposit formed on the yarn(s).

In an embodiment, the second injection direction forms an angle lying in the range 30° to 60° with the second longitudinal axis.

Such a characteristic serves to further improve the quality of the deposited formed on the yarn(s).

In an embodiment, the first zone may extend along a first longitudinal axis and the first injector device may present injection orifices opening out into the first zone, these injection orifices being offset along the first longitudinal axis.

It is possible to inject distinct portions of the first gas phase into the first zone through each of the injection orifices of the first injector device.

In an embodiment, the second zone may extend along a second longitudinal axis and the second injector device may present injection orifices opening out into the second zone, these injection orifices being offset along the second longitudinal axis.

It is possible to inject distinct portions of the second gas phase into the second zone through each of the injection orifices of the second injector device.

Injecting a gas phase as a plurality of portions through injection orifices that are offset along the longitudinal axis of a treatment zone serves advantageously to reduce the generation of undesirable solids away from the useful zone, thereby further improving the quality of the deposit that is formed.

In an embodiment, the wall is coated in a layer that reflects infrared radiation.

The term "layer that reflects infrared radiation" should be understood as a layer that presents a mean reflection coefficient in the range 5% to 50% over the wavelength range from 1000 nanometers (nm) to 8000 nm. The presence of such a layer serves to control the temperature that is imposed in the second zone without needing to have a heater system in the second zone. The thickness of the layer that reflects infrared radiation may lie in the range 0.001 millimeters (mm) to 1 mm. By modifying the thickness of the layer, it is possible to modulate its reflection coefficient for infrared radiation.

By way of example, the layer that reflects infrared radiation may be made of indium oxide, of tin oxide, or of indium tin oxide.

In an embodiment, the first zone may surround the second zone and the conveyor system may also be configured to position the yarns for treatment in circumferential manner in each of the first and second zones.

Such positioning of the yarns around the circumferences of the treatment zones serves to increase the quantity of the yarns treated per unit time compared with the situation in which the yarns are positioned in rectilinear manner.

In an embodiment, the conveyor system may include an element for adjusting the travel speed of said at least one yarn through the treatment chamber.

Advantageously, such a characteristic makes it easy to vary the thicknesses of the layers that are formed by modifying the travel speed of said at least one yarn through the treatment chamber.

The present invention also provides a method of coating one or more yarns by a vapor deposition method by using a device as described above, the method comprising at least the following steps:

injecting the first gas phase into the first zone and the second gas phase into the second zone;

transporting at least one yarn by means of the conveyor system through the treatment chamber, during which:
said at least one yarn passes through either the first zone or the second zone so as to form a first layer on said at least one yarn by vapor deposition respectively from the first gas phase or from the second gas phase; and then
said at least one yarn coated in the first layer passes through the second zone or the first zone so as to form a second layer on said first layer by vapor deposition respectively from the second gas phase or from the first gas phase; and removing the residual first gas phase from the first zone and the residual second gas phase from the second zone.

The first and second layers may be formed while said at least one yarn is caused to move by the conveyor system through the treatment chamber.

The vapor deposition method that is performed may be chemical vapor deposition (CVD), reactive chemical vapor deposition (RCVD), or physical vapor deposition (PVD).

In an implementation, said at least one yarn may be transported continuously by the conveyor system through the treatment chamber.

In an implementation, the first layer and/or the second layer may be formed by chemical vapor deposition (adding material to the surface of the yarns) or by reactive vapor chemical deposition (transforming the material present at the surfaces of the yarns).

In an implementation, each of the first and second layers may be an interphase coating layer.

By way of example, the interphase coating layer may be made of pyrolytic carbon (PyC), of boron nitride (BN), of boron doped carbon (BC), of silicon nitride ($Si_3N_4$), or of a mixed boron and silicon carbide (Si—B—C).

The present invention also provides a method of fabricating a composite material part, the method comprising at least the following steps:

coating a plurality of yarns with an interphase coating at least by performing a method as described above;

forming a fiber preform at least by performing one or more textile operations on yarns coated in this way with the interphase coating; and densifying the fiber preform with a matrix in order to obtain a composite material part.

Preferably, the fiber preform is obtained by weaving, e.g. by three-dimensional weaving, using yarns coated by the interphase coating.

The matrix may comprise a ceramic material such as silicon carbide, or it may be made of carbon. The matrix may be made by any known type of method such as chemical vapor infiltration or melt infiltration, for example.

By way of example, the part that is made may be a turbine engine blade or a turbine ring sector, for example.

BRIEF DESCRIPTION OF THE DRAWINGS

Other characteristics and advantages of the invention appear from the following description of particular embodiments of the invention given as non-limiting examples, and with reference to the accompanying drawings, in which:

FIG. 1 is a diagrammatic longitudinal section view of an example device of the invention;

FIG. 2 is a fragmentary diagrammatic cross-section view of the FIG. 1 device;

DETAILED DESCRIPTION OF EMBODIMENTS

Figure 3:
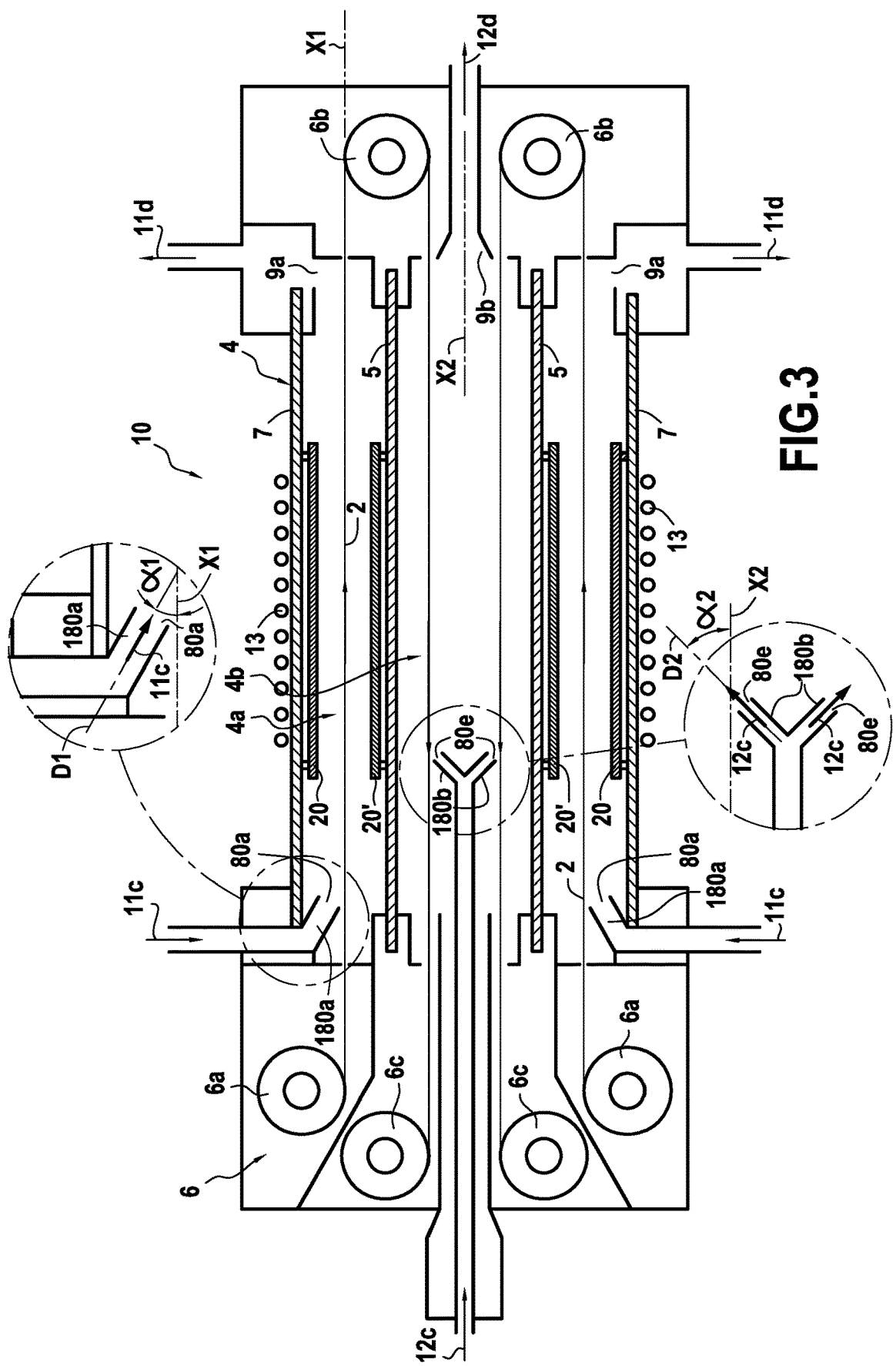
FIG. 3 is a diagrammatic longitudinal section view of a variant device of the invention.

FIG. 1 shows a device 1 of the invention for coating a plurality of yarns 2 by a vapor deposition method. As shown in FIG. 1, the device 1 has a treatment chamber 4 defining at least first and second treatment zones 4a and 4b in which the yarns 2 are to be coated by performing a vapor deposition method. The yarns 2 that are to be coated are not interlinked (in particular the yarns are not woven, knitted, or braided). The yarns 2 have not been subjected to a textile operation and they do not form a fiber structure. Distinct layers are formed by a vapor deposition method in each of the zones 4a and 4b. The device 1 shown in FIG. 1 serves to form a two-layer coating on the yarns 2 by vapor deposition. The yarns 2 may be made of ceramic material, e.g. an oxide, nitride, or carbide material, e.g. silicon carbide (SiC). In a variant, the yarns 2 may be carbon yarns. In an embodiment, some of the yarns 2 may be made of ceramic material and other yarns 2 may be made of carbon. In an embodiment, at least 20 yarns, e.g. 20 to 200 yarns, may be treated simultaneously. In the example shown, the first zone 4a surrounds the second zone 4b and is separated therefrom by an internal circumferential wall 5. The first zone 4a extends along a first longitudinal axis $X_1$. The first treatment zone 4a is present between an internal circumferential wall 5 and an external circumferential wall 7. The first zone 4a is of annular shape when observed in section perpendicularly to the first longitudinal axis $X_1$. In the example shown in FIGS. 1 and 2, the first zone 4a is generally circular in shape when observed in section perpendicularly to the first longitudinal axis. Nevertheless, it would not go beyond the ambit of the invention for the first zone to have some other shape, such as a shape that is generally elliptical or polygonal, e.g. rectangular or square, when observed in section perpendicularly to the first longitudinal axis. The second zone 4b extends along a second longitudinal axis $X_2$, which is parallel to the first longitudinal axis $X_1$ in the example shown. In the example shown in FIGS. 1 and 2, the second zone 4b is generally circular in shape when observed perpendicularly to the second longitudinal axis. Nevertheless, it would not go beyond the ambit of the invention for the second zone to have some other shape when observed in section perpendicularly to the second longitudinal axis, such as a shape that is generally elliptical or polygonal, e.g. rectangular or square. In the example shown, the internal circumferential wall 5 and the external circumferential wall 7 are coaxial (see FIG. 2). The distance $d_1$ between the internal circumferential wall 5 and the external circumferential wall 7 may be greater than or equal to 0.02 meters (m) (see FIG. 2). This distance $d_1$ may be less than or equal to 0.1 m, e.g. lying in the range 0.02 m to 0.1 m. The distance $d_1$ is measured perpendicularly to the first longitudinal axis $X_1$.

The yarns 2 are distributed circumferentially in the first and second zones 4a and 4b (see FIG. 2). Such a distribution of the yarns 2 serves advantageously to increase the number of yarns treated per unit time compared with a rectilinear distribution of yarns.

The conveyor system 6 is configured to transport yarns through the first and second zones 4a and 4b. More precisely, in the example shown in FIG. 1, the conveyor system 6 is configured to transport yarns 2 in succession through the first zone 4a and through the second zone 4b. Thus, in the example, the yarns 2 are transported by the conveyor system 6 through the first zone 4a and then through the second zone 4b. In a variant, the conveyor system may be configured to transport the yarns in succession through the second zone and through the first zone (with the yarns passing initially through the second zone and subsequently through the first zone).

In the example shown, the conveyor system 6 comprises a first set of pulleys 6a, a second set of pulleys 6b, and a third set of pulleys 6c. In the example shown, each of the first, second, and third sets of pulleys 6a, 6b, and 6c is positioned in annular manner around the second longitudinal axis $X_2$. The pulleys 6a of the first set are positioned in annular manner around the second longitudinal axis $X_2$. The pulleys 6b of the second set are positioned in annular manner around the second longitudinal axis $X_2$. The pulleys 6c of the third set are positioned in annular manner around the second longitudinal axis $X_2$. The pulleys 6a of the first set and the pulleys 6b of the second set are configured to transport the yarns through the first zone 4a. The pulleys 6b of the second set and the pulleys 6c of the third set are configured to transport the yarns 2 through the second zone 4b.

The conveyor system 6 is configured so that the yarns 2 perform two successive passes through the treatment chamber 4. In the example shown, the yarns 2 for treatment as transported by the pulleys of the first and second sets begin by making a first pass through the first zone 4a, and then the same yarns 2, as transported by the pulleys of the second and third sets, perform a second pass through the second zone 4b.

The device 1 also has a first injector device to inject a first treatment gas phase into the first zone 4a and a first removal device configured to remove the residual first gas phase 11d from the first zone 4a. The first removal device is configured to remove the residual first gas phase 11d from the treatment chamber 4 via one or more outlet orifices 9a. In order to remove the residual first gas phase 11d the outlet orifice(s) 9a is/are in communication with suction means such as a vacuum pump (not shown).

The first injector device also presents at least first and second injection orifices 8a and 8b offset along the first longitudinal axis $X_1$ and opening out into the first zone 4a. Advantageously, a first portion 11a of the first gas phase may be injected into the first zone 4a through the first injection orifice 8a, and a second portion 11b of the first gas phase, different from the first portion, may be injected into the first zone 4a through the second injection orifice 8b. In the example shown, the first injector device comprises a plurality of pairs of such first and second injection orifices 8a and 8b. It would not go beyond the ambit of the present invention for the first injector device to have a single injection orifice through which the first gas phase is injected into the first zone, which orifice could be annular in shape, for example.

In the example shown in FIG. 1, the first injector device has a plurality of first injection channels 18a, each opening out into the first zone 4a through a first injection orifice 8a, and a plurality of second injection channels 18b, each opening out into the first zone 4a through a second injection orifice 8b. The first injection channels 18a are configured to inject a portion of the first gas phase 11a that is distinct from the portion 11b that is be injected through the second injection channels 18b. Injection through the first and second channels 18a and 18b is performed in an injection direction that is substantially parallel to the first longitudinal axis $X_1$. Respective gas stream distributor elements for distributing the injected gas phases 11a and 11b over the sector of the first zone 4a may be positioned at the outlets from the channels 18a and 18b.

The device 1 also has a second injector device configured to inject a second treatment gas phase into the second zone 4b together with a second removal device configured to remove the residual second gas phase 12d form the second zone 4b. The second removal device is configured to remove the residual second gas phase 12d from the treatment chamber 4 through one or more outlet orifices 9b. In order to remove the residual second gas phase 12d, the outlet orifice(s) 9b is/are in communication with suction means such as a vacuum pump (not shown).

The injector device presents at least first and second injection orifices 8d and 8e that are offset along the second longitudinal axis $X_2$ and that open out into the second zone 4b. Advantageously, a first portion 12a of the second gas phase may be injected into the second zone 4b through the first injection 8d, and a second portion 12b of the second gas phase, different from the first portion, may be injected into the second zone 4b through the second injection orifice 8e. In an embodiment, the second injector device may comprise a plurality of pairs of such first and second injection orifices. It would not go beyond the ambit of the present invention for the second injector device to have a single injection orifice through which the second gas phase is injected into the second zone 4b.

The second injector device has a first injection channel 18c opening out into the second zone 4b through the first injection orifice 8d, and a second injection channel 18d opening out into the second zone 4b through the second injection orifice 8e. In the example shown, the first injection channel 18c of the second injector device, and the second injection channel 18d of the second injector device are each configured to inject a distinct portion of the second gas phase into the second zone 4b along an injection direction that is substantially parallel to the second longitudinal axis $X_2$. As described above relative to the first zone 4a, respective gas stream distributor elements for distributing the injected gas phases 12a and 12b over the section of the second zone 4b may be positioned at the outlets from the channels 18c and 18d.

The device 1 also has a heater system configured to heat the first and second treatment zones 4a and 4b in order to perform vapor deposition. More precisely, the heater system comprises a first susceptor 20, a second susceptor 20', and an induction coil 13. The susceptors 20 and 20' are inductively coupled with the induction coil 13, which is situated outside the treatment chamber 4. In the example shown, the first and second susceptors 20 and 20' are present inside the treatment chamber 4 in the first zone 4a. The first and second susceptors 20 and 20' are annular in shape. The first susceptor 20 is situated beside the external circumferential wall 7 and the second susceptor 20' is situated beside the internal circumferential wall 5. The first zone 4a is radially defined by the first and second susceptors 20 and 20'. The first zone 4a is situated between the first and second susceptors 20 and 20'.

In a variant that is not shown, the device includes an induction coil and a single susceptor, which may be situated inside the treatment chamber or outside it.

The internal circumferential wall 5 is coated in a material that reflects infrared radiation. This serves advantageously to control the temperature imposed in the second zone 4b without any need to place a susceptor in the second zone 4b. Such a characteristic thus contributes to simplifying the structure of the device 1.

In order to coat yarns 2 with an interphase coating, it is possible to perform the following method. The yarns 2 are initially transported through the first zone 4a. One portion of the first gas phase is injected through the first injection orifices 8a and another portion of the first gas phase is injected through the second injection orifices 8b, while the yarns 2 are being transported continuously through the first zone 4a. These two injected portions mix in the working zone so as to form the first gas phase. While the yarns 2 are being transported through the first zone 4a, a first layer of an interphase coating is then formed on the yarns 2 by chemical vapor deposition from the first gas phase. The first gas phase flows along the first longitudinal axis $X_1$ because of the suction performed through the outlet orifices 9a.

The yarns coated in the first interphase coating layer are then transported by the conveyor system 6 into the second treatment zone 4b. As shown, the conveyor system 6 is configured to cause the yarns to turn about (to reverse the travel direction of the yarns). A second treatment gas phase is injected into the second zone 4b by the second injector device in order to form a second layer of an interphase coating by chemical vapor deposition on the yarns already coated by the first layer. As for the first gas phase, one portion of the second gas phase 12a is injected through the first injection orifice 8d, and another portion of the second gas phase 12b is injected through the second injection orifice 8e while the yarns 2 are being continuously transported through the second zone 4b. The residual second gas phase 12d is removed through the outlet orifice 9b. The second layer may be made of a material that is identical to or different from the material forming the first layer. The temperature imposed in the first zone 4a may be different from the temperature imposed in the second zone 4b. In a variant, the temperature imposed in the first zone 4a may be substantially equal to the temperature imposed in the second zone 4b.

The gas phases for use in chemical vapor deposition comprise one or more precursors for the material of the layer to be formed. When a carbon interphase coating is to be formed, the gas phases may include one or more gaseous hydrocarbons, e.g. selected from methane, ethane, propane, and butane. In a variant, the gas phases may include a gaseous precursor for a ceramic material, such as methyl trichlorosilane (MTS). In order to make a given deposit, selecting the precursor(s) for use and also the pressure and temperature conditions to be imposed in the first and second treatment zones forms part of the general knowledge of the person skilled in the art.

As mentioned above, the conveyor system 6 may advantageously include an element for adjusting the travel speed of the yarns 2 through the treatment chamber 4. By varying the travel speed of the yarns 2, a user can thus modify the residence time of the yarns through the treatment zones, and consequently modify the thickness of the layer(s) formed on the yarns. Once the travel speed has been set, the person skilled in the art knows, on the basis of general knowledge, how to determine the values that should be used for the flow rates of the gas phases in order to obtain the desired chemical vapor deposit.

The travel speed imposed on the yarns 2 throughout all or a portion of their path through the treatment chamber 4 may be greater than or equal to 0.01 meters per minute (m/min). The travel speed imposed on the yarns 2 during all or a portion of their path through the treatment chamber 4 may be less than or equal to 5 m/min, and for example may lie in the range 0.01 m/min to 5 m/min. By way of example, the flow rate of the first injected gas phase and/or the flow rate of the second injected gas phase may be greater than or equal to 0.5 liters per minute (L/min), e.g. lying in the range 0.5 L/m to 5 L/m. When one portion of a gas phase is injected through one injection orifice and when another portion of the gas phase is injected through another injection orifice, the flow rate of said gas phase is equal to the sum of the flow rates of the various portions of said injected gas phase.

In a variant that is not shown, the treatment chamber defines at least three concentric treatment zones in order to form a coating made up of at least three layers.

FIG. 3 shows a variant device 10 of the invention in which a plurality of injection channels 180a open out into the first zone 4a through orifices 80a. Each injection channel 180a is configured to inject the first gas phase 11c into the first zone 4a along an injection direction (referenced $D_1$ for one of the injection channels 180a) that is not parallel to the first longitudinal axis $X_1$. As mentioned above, such a characteristic serves to improve the filling of the section of the first zone 4a with the first gas phase 11a, thereby further improving the quality of the deposit formed on the yarn(s). In the example shown, the injection direction $D_1$ forms an angle $\alpha_1$ lying in the range 30° to 60° with the first longitudinal axis $X_1$. In the same manner, the device 10 has a plurality of injection channels 180b that open out into the second zone 4b through orifices 80e. Each injection channel 180b is configured to inject the second gas phase 12c into the second zone 4b along an injection direction (referenced $D_2$ for one of the injection channels 180b) that is not parallel to the second longitudinal axis $X_2$. As mentioned above, such a characteristic serves to improve the filling of the section of the second zone 4b by the second gas phase 12c, thereby further improving the quality of the deposit formed on the yarn(s). In the example shown, the injection direction $D_2$ forms an angle $\alpha_2$ lying in the range 30° to 60° with the second longitudinal axis $X_2$.

It would not go beyond the ambit of the invention for the device to have injection channels, each enabling only a portion of the treatment gas phase to be injected into a treatment zone at a non-zero angle relative to the longitudinal axis of said treatment zone.

Figure 5:
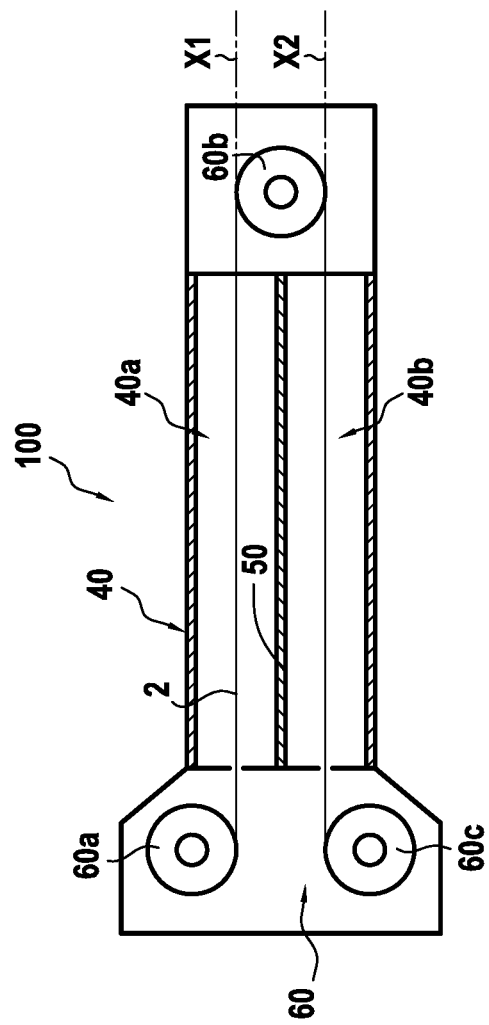
FIG. 5 is a fragmentary diagrammatic longitudinal section view of the device shown in FIG. 4.
Figure 4:
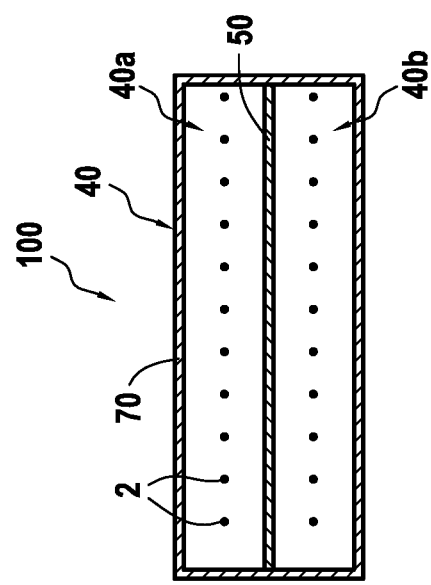
FIG. 4 is a fragmentary diagrammatic cross-section view of another variant device of the invention.

FIG. 4 shows a variant device 100 of the invention in which the first zone 40a is superposed on the second zone 40b. The first and second zones 40a and 40b are separated by the wall 50. The treatment chamber 40 is defined by the wall 70. In the example shown in FIG. 4, the first zone 40a is generally rectangular in shape when observed in section perpendicularly to its longitudinal axis $X_1$. The second zone 40b is also generally rectangular in shape when observed in section perpendicularly to its longitudinal axis $X_2$. It would not go beyond the ambit of the invention for the sections of the first and second zones to be of other shapes. As shown in FIG. 5, the conveyor 60 has a first set of pulleys 60a, a second set of pulleys 60b, and a third set of pulleys 60c. The pulleys 60a of the first set and the pulleys 60b of the second set are configured to transport the yarns through the first zone 40a. The pulleys 60b of the second set and the pulleys 60c of the third set are configured to transport the yarns 2 through the second zone 40b.

The conveyor system 60 is configured to cause the yarns 2 to make two successive passes through the treatment chamber 40. In the example shown, the yarns 2 as transported by the pulleys of the first and second sets begin by making a first pass through the first zone 40a, and then the yarns 2 as transported by the pulleys of the second and third sets make a second pass through the second zone 40b. In the example shown in FIG. 5, the longitudinal axis $X_2$ of the second treatment zone 40b is parallel to the longitudinal axis $X_1$ of the first treatment zone 40a. It would not go beyond the ambit of the invention for the longitudinal axis of the first treatment zone to form a non-zero angle with the longitudinal axis of the second treatment zone.

EXAMPLE

A two-layer interphase coating made of boron nitride and silicon carbide was deposited by a vapor deposition method on a plurality of yarns traveling through a treatment chamber of the type shown in FIG. 1. The yarns were carbon yarns or yarns made of ceramic material (SiC or Si—C—O yarns, such as Nicalon®, Hi-Nicalon®, or Hi-Nicalon® Type S yarns from the supplier Nippon Carbon). A first treatment gas phase was injected into the first treatment zone 4a and a second treatment gas phase was injected into the second treatment zone 4b. The diameter of the external circumferential wall 7 was 0.5 m and the diameter of the internal circumferential wall 5 was 0.45 m. The value of the travel speed of the yarns in the first and second treatment zones was imposed at 100 millimeters per minute (mm/min). The heating length (i.e. the length of the susceptors) was 500 mm. The internal circumferential wall 5 was covered in a layer of indium tin oxide (material that reflects the infrared), presenting a thickness equal to 0.002 mm.

The following parameters were imposed to perform vapor deposition in the first treatment zone 4a (relating to the first gas phase):
  temperature: 1100° C.;
  coefficient alpha (corresponding to the ratio of the volume flow rate of $NH_3$ divided by the volume flow rate of $BCl_3$): 1.3;
  coefficient beta (corresponding to the ratio of the volume flow rate of $H_2$ divided by the volume flow rate of $BCl_3$ plus the volume flow rate of $NH_3$): 1;
  total pressure 0.2 kilopascals (kPa);
  residence time 87 milliseconds (ms); and
  treatment duration: 300 min.

More precisely, the following flow rates were imposed for the first treatment phase:
  $H_2$: 1.69 L/min;
  $NH_3$: 0.95 L/min;
  $BCl_3$: 0.73 L/min;
  total: 3.38 L/min.

The following parameters were imposed for performing vapor deposition in the second treatment zone 4b (relating to the second gas phase):
  temperature: 1000° C.;
  coefficient alpha (corresponding to the ratio of the volume flow rate of $H_2$ divided by the volume flow rate of MTS): 8;
  total pressure: 100 kPa;
  residence time 2000 ms; and
  treatment duration: 300 min.

More precisely, the following flow rates were imposed for the second treatment gas phase:
  $H_2$: 3.2 L/min;
  MTS: 0.4 L/min.

Those treatment conditions made it possible to obtain a two-layer interphase coating of boron nitride and silicon carbide having a total thickness of about 300 nm.

The term "lying in the range . . . to . . . " should be understood as including the bounds.

The invention claimed is:

1. A device for coating one or more yarns by a vapor deposition method, the device comprising:
   a treatment chamber defining at least a first treatment zone and a second treatment zone in which at least one yarn is to be coated by performing a vapor deposition method, the first and second zones extending along a longitudinal direction and being separated by a wall and the first zone completely surrounding the second zone, and the wall completely surrounding the second zone and extending along said longitudinal direction;
   a conveyor system configured to transport said at least one yarn through the first and second zones;
   a first injector configured to inject a first treatment gas into the first zone and a first removal device configured to remove the residual first treatment gas from the first zone; and
   a second injector configured to inject a second treatment gas into the second zone, and a second removal device configured to remove the residual treatment second gas from the second zone.

2. A device according to claim 1, wherein the first zone extends along a first longitudinal axis and wherein the first injector includes at least a first injection channel that opens out into the first zone, said first injection channel being configured to inject at least a portion of the first treatment gas into the first zone along a first injection direction that is not parallel to the first longitudinal axis.

3. A device according to claim 2, wherein the first injection direction forms an angle lying in the range 30° to 60° with the first longitudinal axis.

4. A device according to claim 1, wherein the second zone extends along a second longitudinal axis and wherein the second injector includes at least one second injection channel that opens out into the second zone, said second injection channel being configured to inject at least a portion of the second treatment gas into the second zone along an injection direction that is not parallel to the second longitudinal axis.

5. A device according to claim 4, wherein the second injection direction forms an angle lying in the range 30° to 60° with the second longitudinal axis.

6. A device according to claim 1, wherein the first zone extends along a first longitudinal axis and wherein the first injector includes injection orifices opening out into the first zone, the injection orifices being offset along the first longitudinal axis.

7. A device according to claim 1, wherein the second zone extends along a second longitudinal axis and wherein the second injector includes injection orifices opening out into the second zone, the injection orifices being offset along the second longitudinal axis.

8. A device according to claim 1, wherein the wall is coated in a layer that reflects infrared radiation and that presents a mean coefficient of reflection lying in the range 5% to 50% over the wavelength range 1000 nm to 8000 nm.

9. A device according to claim 1, wherein the conveyor system is adapted to adjust a travel speed of said at least one yarn through the treatment chamber.

10. A device according to claim 1, wherein the second zone extends along a second longitudinal axis, the device further comprising a plurality of sets of guide elements positioned in annular manner around the second longitudinal axis and configured to position the yarns for treatment in circumferential manner in each of the first and second zones.

11. A device according to claim 1, wherein the wall is an internal circumferential wall, the first treatment zone being present between the internal circumferential wall and an external circumferential wall.

12. A device according to claim 1, wherein the conveyor system includes one or more first pulleys constructed and arranged to change a direction of transport of said yarn such that the yarn perform two successive passes through the treatment chamber, said two successive passes including a first pass through one of the first and second zones and a second pass through the other one of the first and second zones.

13. A device according to claim 12, wherein the conveyor system includes one or more second pulleys and one or more third pulleys, wherein the one or more first pulleys, the one or more second pulleys and the one or more third pulleys are constructed and arranged such the yarn is transported between the second one or more pulleys and the first one or more pulleys through the first treatment zone in a first direction and between the third one or more pulleys and the first one or more pulleys through the second treatment zone in a second direction different from the first direction.

14. A device according to claim 13, wherein the first direction is opposite to the second direction.

15. A method of coating one or more yarns by a vapor deposition method by using a device in accordance with claim 1, the method comprising:
   injecting the first treatment gas into the first zone and the second treatment gas into the second zone;
   transporting at least one yarn by means of the conveyor system through the treatment chamber, during which:
      said at least one yarn passes through either the first zone or the second zone so as to form a first layer on said at least one yarn by vapor deposition respectively from the first treatment gas or from the second treatment gas; and then
      said at least one yarn coated in the first layer passes through the second zone or the first zone so as to form a second layer on said first layer by vapor deposition respectively from the second treatment gas or from the first treatment gas; and
   removing the residual first treatment gas from the first zone and the residual second treatment gas from the second zone.

16. A method according to claim 15, wherein said at least one yarn is transported continuously by the conveyor system through the treatment chamber.

17. A method according to claim 15, wherein the first layer and/or the second layer is/are formed by chemical vapor deposition or by reactive chemical vapor deposition.

18. A method according to claim 15, wherein each of the first and second layers comprises an interphase coating layer.

19. A method of fabricating a composite material part, the method comprising:
   coating a plurality of yarns with an interphase coating at least by performing a method according to claim 18;
   forming a fiber preform at least by performing one or more textile operations on yarns coated in this way with the interphase coating; and
   densifying the fiber preform with a matrix in order to obtain a composite material part.

* * * * *